US012108601B2

(12) United States Patent
Bicksler et al.

(10) Patent No.: US 12,108,601 B2
(45) Date of Patent: Oct. 1, 2024

(54) BACK GATES AND RELATED APPARATUSES, SYSTEMS, AND METHODS

(71) Applicant: Micron Technology, Inc., Boise, ID (US)

(72) Inventors: Andrew Bicksler, Nampa, ID (US); Marc Aoulaiche, Boise, ID (US); Albert Fayrushin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 224 days.

(21) Appl. No.: 17/445,867

(22) Filed: Aug. 25, 2021

(65) Prior Publication Data

US 2021/0384201 A1    Dec. 9, 2021

Related U.S. Application Data

(63) Continuation of application No. 16/735,098, filed on Jan. 6, 2020, now Pat. No. 11,127,751.
(Continued)

(51) Int. Cl.
*H10B 43/35* (2023.01)
*G06F 3/06* (2006.01)
(Continued)

(52) U.S. Cl.
CPC .......... *H10B 43/35* (2023.02); *G06F 3/0604* (2013.01); *G06F 3/0659* (2013.01);
(Continued)

(58) Field of Classification Search
CPC .... H10B 43/35; H10B 43/27; G11C 16/0483; G11C 16/08; G11C 16/24; G11C 16/3427; G06F 3/0604; G06F 3/0659; G06F 3/0679
See application file for complete search history.

(56) References Cited

U.S. PATENT DOCUMENTS 9,355,727 B1 * 5/2016 Zhang ................... G11C 16/10
10,892,279 B1 * 1/2021 Sakotsubo .......... H01L 29/7883
(Continued)

FOREIGN PATENT DOCUMENTS

| CN | 104730137 A | 6/2015 |
|---|---|---|
| CN | 110010700 A | 7/2019 |
| WO | 2019/148170 A2 | 8/2019 |

OTHER PUBLICATIONS

Chinese First Office Action for Application No. 202011576664.4, issued Dec. 14, 2021, 14 pages.
(Continued)

*Primary Examiner* — Son L Mai
(74) *Attorney, Agent, or Firm* — TraskBritt

(57) ABSTRACT

Back gates and related apparatuses, systems, and methods are disclosed. An apparatus includes a channel material including a first side and a second side opposite the first side. The apparatus also includes word lines comprising electrically conductive material spaced along the first side of the channel material. The apparatus further includes a back gate comprising electrically conductive material proximate to the second side of the channel material. A method includes biasing a bit line and a word line associated with a memory cell according to a memory operation and biasing the back gate while biasing the bit line and the word line.

18 Claims, 9 Drawing Sheets

Related U.S. Application Data

(60) Provisional application No. 62/955,538, filed on Dec. 31, 2019.

(51) Int. Cl.
*G11C 16/04* (2006.01)
*G11C 16/08* (2006.01)
*G11C 16/24* (2006.01)
*G11C 16/34* (2006.01)
*H10B 43/27* (2023.01)

(52) U.S. Cl.
CPC ........ *G06F 3/0679* (2013.01); *G11C 16/0483* (2013.01); *G11C 16/08* (2013.01); *G11C 16/24* (2013.01); *G11C 16/3427* (2013.01); *H10B 43/27* (2023.02)

(56) References Cited

U.S. PATENT DOCUMENTS

| | | | |
|---|---|---|---|
| 11,127,751 B2* | 9/2021 | Bicksler | G06F 3/0659 |
| 2006/0284236 A1 | 12/2006 | Bhattacharyya | |
| 2016/0163729 A1* | 6/2016 | Zhang | H01L 29/792 257/324 |
| 2017/0098655 A1 | 4/2017 | Costa et al. | |
| 2021/0066344 A1* | 3/2021 | Son | H01L 29/4916 |

OTHER PUBLICATIONS

Chinese Second Office Action for Chinese Application No. 202011576664.4, dated May 25, 2022, 8 pages with translation.

* cited by examiner

BACK GATES AND RELATED APPARATUSES, SYSTEMS, AND METHODS

CROSS-REFERENCE TO RELATED APPLICATION

This application is a continuation of U.S. patent application Ser. No. 16/735,098, filed Jan. 6, 2020, now U.S. Pat. No. 11,127,751, issued Sep. 21, 2021, which application claims the benefit under 35 U.S.C. § 119(e) of U.S. Provisional Patent Application Ser. No. 62/955,538 filed Dec. 31, 2019, the disclosure of each of which is hereby incorporated herein in its entirety by this reference.

TECHNICAL FIELD

The present disclosure relates generally to back gates in three-dimensional memory devices, and more specifically to back gates of memory cells in three-dimensional NAND memory devices.

BACKGROUND

The demand for ever greater numbers of memory cells in ever decreasing memory chip areas fueled the development of three-dimensional memory devices. In three-dimensional memory devices, rather than relying only upon development of smaller memory cells and related circuitry to decrease the total memory chip area, memory cells and circuitry are spaced vertically (e.g., in layers) as well as horizontally to fit larger numbers of memory cells in smaller memory chip areas.

BRIEF DESCRIPTION OF THE SEVERAL VIEWS OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1:
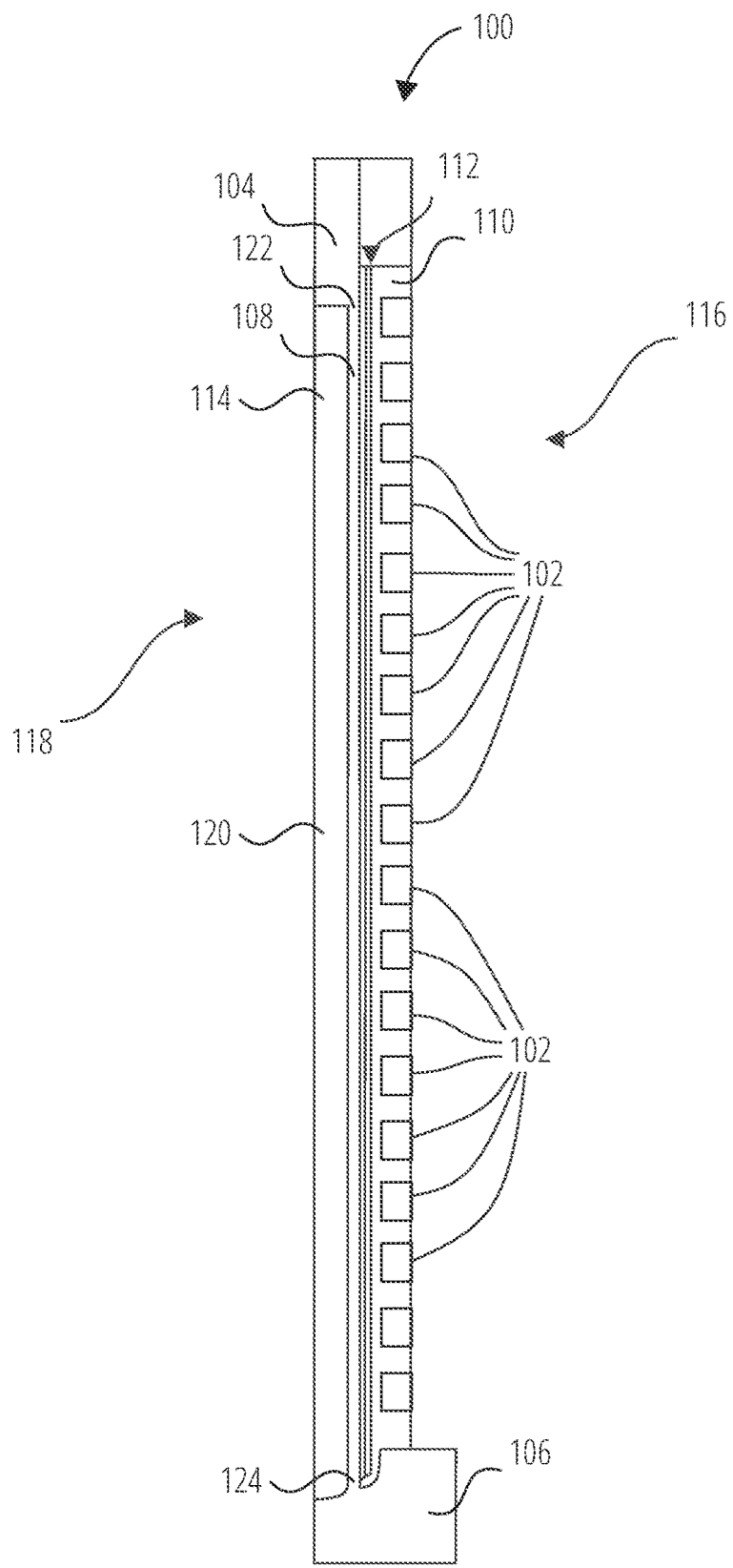
FIG. 1 is a cross-sectional view of a pillar including memory cells, according to some embodiments.

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments enabled herein may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. In some instances, similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawings could be arranged and designed in a wide variety of different configurations. Thus, the following description of various embodiments is not intended to limit the scope of the present disclosure but is merely representative of various embodiments. While the various aspects of the embodiments may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art would understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the embodiments disclosed herein may be implemented or performed with a general purpose processor, a special purpose processor, a digital signal processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to embodiments of the present disclosure.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may comprise one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

In three-dimensional NAND memory, a string current of a channel material affects how well a memory device functions. For example, it is beneficial for the string current to be high when a memory cell is accessed and as low as possible (preferably zero) when word lines are turned off (e.g., resulting in as large as possible of an SG on/off margin). It is also beneficial to maximize a selected gate (SG) gate induced drain leakage (GIDL) and hot carrier injection, and reduce read disturb errors.

Disclosed herein are apparatuses, systems, and method related to back gates of various configurations in pillars including memory cells. The back gates are configured to improve string current (e.g., on current, off current, SG on/off margin), increase SG GIDL and hot carrier injection, and reduce read disturb errors. The addition of a back gate may create some device gains that may relax other constraints. For example, using a back gate to improve source side selected gate (SGS) GIDL enables drain side gate select to be optimized for off current instead of attempting to optimize for both off current and GIDL. In a similar way, optimization of a drain side selected gate (SGD) back gate itself may enable a wider window between GIDL and off current. A source side back gate may improve SGS GIDL. A BL side back gate may improve SGD GIDL. Also, a relatively longer back gate may result in relatively larger improvements in GIDL, as compared with relatively shorter back gates. Some boosting degradation, however, may result from relatively longer (e.g., fully protruded) back gates.

In some embodiments an apparatus includes a channel material including a first side and a second side opposite the first side. The apparatus also includes word lines including electrically conductive material spaced along the first side of the channel material. The apparatus further includes a back gate comprising electrically conductive material proximate to the second side of the channel material.

In some embodiments an apparatus includes a channel material, a first insulator extending proximate to a first side of the channel material, word lines on or in the first insulator, a second insulator extending proximate to a second side of the channel material opposite the first insulator, and a back gate on or in the second insulator. The first insulator includes an electrically insulating material. The word lines include electrically conductive material. The second insulator includes an electrically insulating material.

In some embodiments a method of accessing a memory cell includes biasing a bit line and a word line associated with the memory cell according to a memory operation. The word line is one of word lines spaced along a first side of a channel material. The method also includes biasing a back gate proximate to a second side of the channel material while biasing the bit line and the word line. The second side of the channel material is opposite the first side of the channel material.

FIG. 1 is a cross-sectional view of a pillar 100 including memory cells, according to some embodiments. The pillar 100 includes a channel material 108 including a first side 116 and a second side 118 opposite the first side 116. The pillar 100 also includes a bit line 104 including an electrically conductive material (e.g., doped polysilicon, a metal, etc.) at a first end of the channel material 108 and a source region 106 including a doped semiconductor material at a second end 124 of the channel material 108. The pillar 100 further includes word lines 102 including electrically conductive material spaced along the first side 116 of the channel material 108. The pillar 100 also includes a back gate 120 including electrically conductive material (e.g., a doped polysilicon, a metal, etc.) proximate to the second side 118 of the channel material 108.

The pillar 100 includes memory cells. By way of non-limiting example, the pillar 100 includes three-dimensional NAND Flash memory cells. The channel material 108 includes a doped semiconductor material including free charge carriers (e.g., electrons or holes). Each of the word lines 102 may serve as a gate for one of the memory cells of the pillar 100. The bit line 104 is electrically connected to the first end 122 of the channel material 108 and may serve as a drain for each of the memory cells of the pillar 100. The pillar 100 includes a source region 106 comprising a doped semiconductor material. The source region 106 is electrically connected to the second end 124 of the channel material 108 and may serve as a common source for each of the memory cells of the pillar 100.

The pillar 100 includes a first insulator 110 including an electrically insulating material (e.g., an oxide, a nitride, or combinations thereof) on or in the first side 116 of the channel material 108. In other words, the first insulator 110 is between the channel material 108 and the word lines 102. The first insulator 110 may also be configured to electrically isolate the word lines 102 from each other. The first insulator 110 includes electrical insulators 112 extending along the channel material 108. The electrical insulators 112 may include one or more charge trap insulators (e.g., silicon nitride). Accordingly, different amounts of electrical charge may be stored in the first insulator 110 (e.g., in the charge trap insulators of the electrical insulators 112) proximate to a specific word line responsive to specific voltage biases applied to the word lines 102 and the bit line 104. An electrical conductivity and/or an electrical resistance of the channel material 108 proximate to the stored charge in the charge trap insulators of the electrical insulators 112 may be influenced by the amount of charge stored in the charge trap insulators of the electrical insulators 112. Accordingly, not only may the amount of charge stored proximate to each of the word lines 102 be controlled, the amount of charge may also be detected by applying specific biases to the bit line 104 and the word lines 102 and measuring an electrical current and/or a voltage potential of the channel material 108.

Different logic values may be assigned to the different amounts of electrical charge. By way of non-limiting example, a logic level "0" may be assigned to a first amount of electrical charge, and a logic level "1" may be assigned to another different amount of electrical charge. Also, by way of non-limiting example, more than two different logic levels may be assigned to more than two different amounts of electrical charge (e.g., multi-bit memory cells). Accordingly, a specific logic level may be programmed to (i.e., written to) and detected from (i.e., read from) each of the memory cells.

The memory cells of the pillar 100 may be accessed by biasing the word lines 102 and the bit line 104 as appropriate for various memory operations (e.g., read, write, erase, etc.), as will be apparent to those of ordinary skill in the art. A specific memory cell corresponding to a specific one of the word lines 102 may be accessed by biasing the others of the word lines 102 to cause the channel material 108 to be electrically conductive proximate to the others of the word lines 102. As a result, the bit line 104 serving as the drain and the source region 106 serving as the source may be electrically connected to the specific portion of the channel material 108 that is proximate to the specific one of the word lines 102 corresponding to the specific memory cell. Thus, the specific memory cell may function as a Flash transistor with the specific one of the word lines 102 as the gate, the source region 106 as the source, the bit line 104 as the drain, and the electrical insulators 112 as the charge trap insulator. With the specific memory cell accessed, biases corresponding to read, write, and erase operations may be applied to the specific memory cell in isolation from others of the memory cells of the pillar 100. Of course, some memory operations (e.g., erase) may in some instances be applied to all the memory cells in the pillar 100 simultaneously.

The pillar 100 further includes a second insulator 114 including an electrically insulating material extending proximate to the second side 118 of the channel material 108 opposite the first insulator 110. The back gate 120 is positioned on or in the second insulator 114. In other words, the second insulator 114 is position between the back gate 120 and the second side 118 of the channel material 108. The back gate 120 may be configured in various different ways. Examples of different configurations of the back gate 120 according to embodiments of the disclosure are discussed with reference to FIG. 3, FIG. 4, FIG. 5, FIG. 6, and FIG. 7, each of which illustrates an example of the pillar 100 of FIG. 1.

Figure 3:
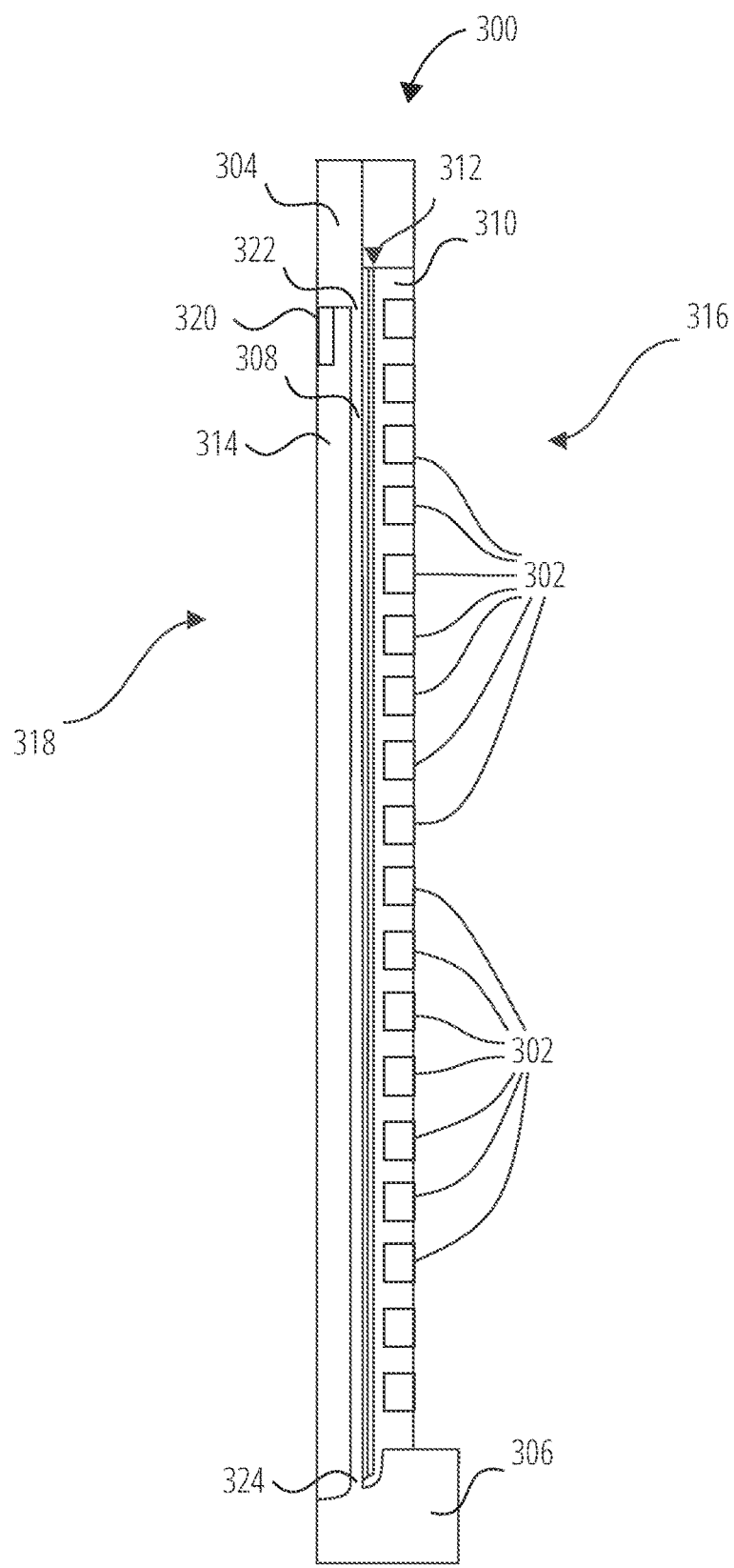
FIG. 3 is a cross-sectional view of a pillar including memory cells and having a partial-length back gate electrically connected to a bit line, according to some embodiments.
Figure 5:
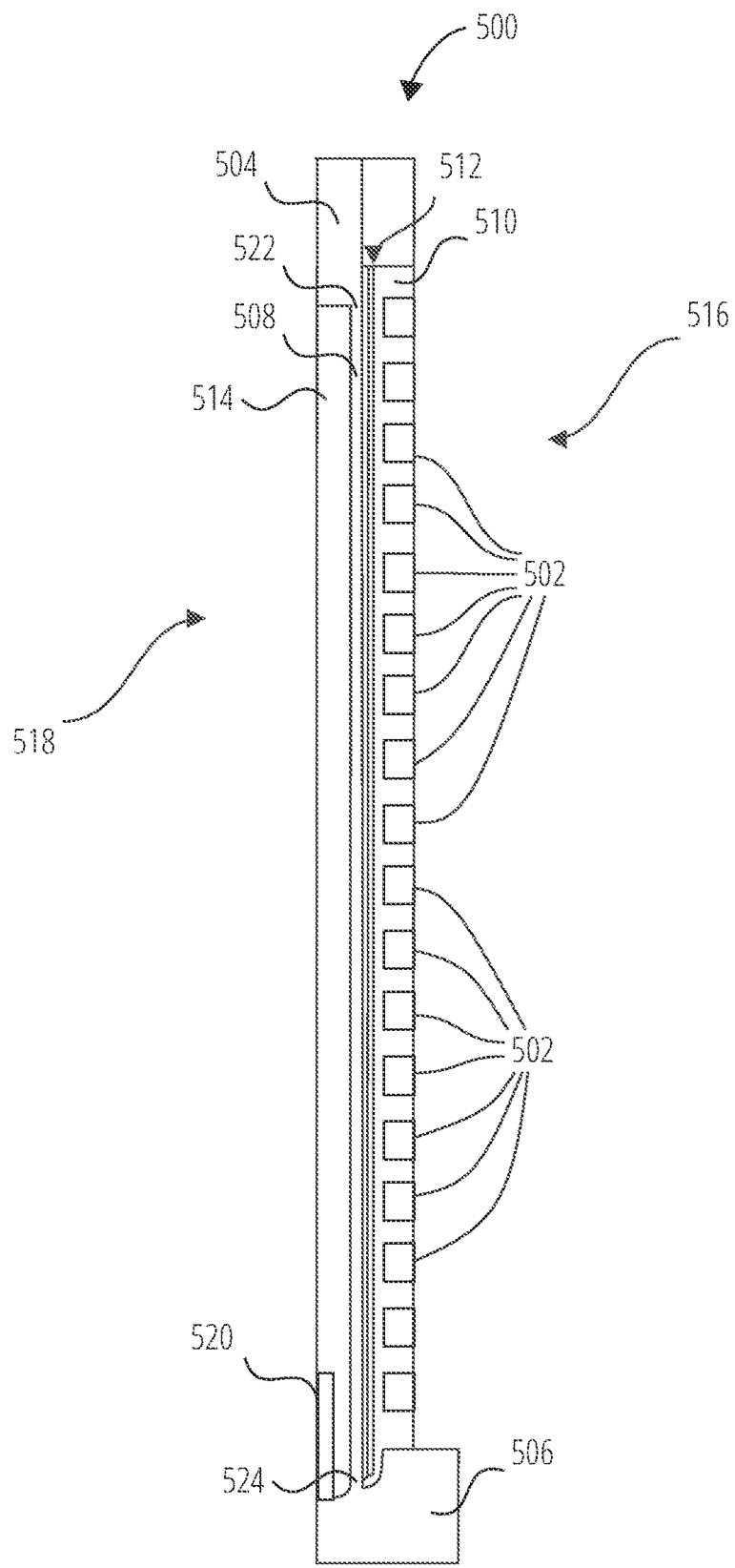
FIG. 5 is a cross-sectional view of a pillar including memory cells and having a partial-length back gate electrically connected to a source region, according to some embodiments.

In some embodiments the back gate 120 extends proximate to the second side 118 of the channel material 108 along only a portion of an entire length of the channel material 108. FIG. 3 and FIG. 5 illustrate examples of pillars (pillar 300 and pillar 500, respectively) including back gates (back gate 320 and back gate 520, respectively) that extend along only a portion of the entire length of the channel material (channel material 308 and channel material 508, respectively). In some such embodiments the back gate 120 is electrically connected to the bit line 104 (e.g., FIG. 3). In other such embodiments the back gate 120 is electrically connected to the source region 106 (e.g., FIG. 5).

Figure 4:
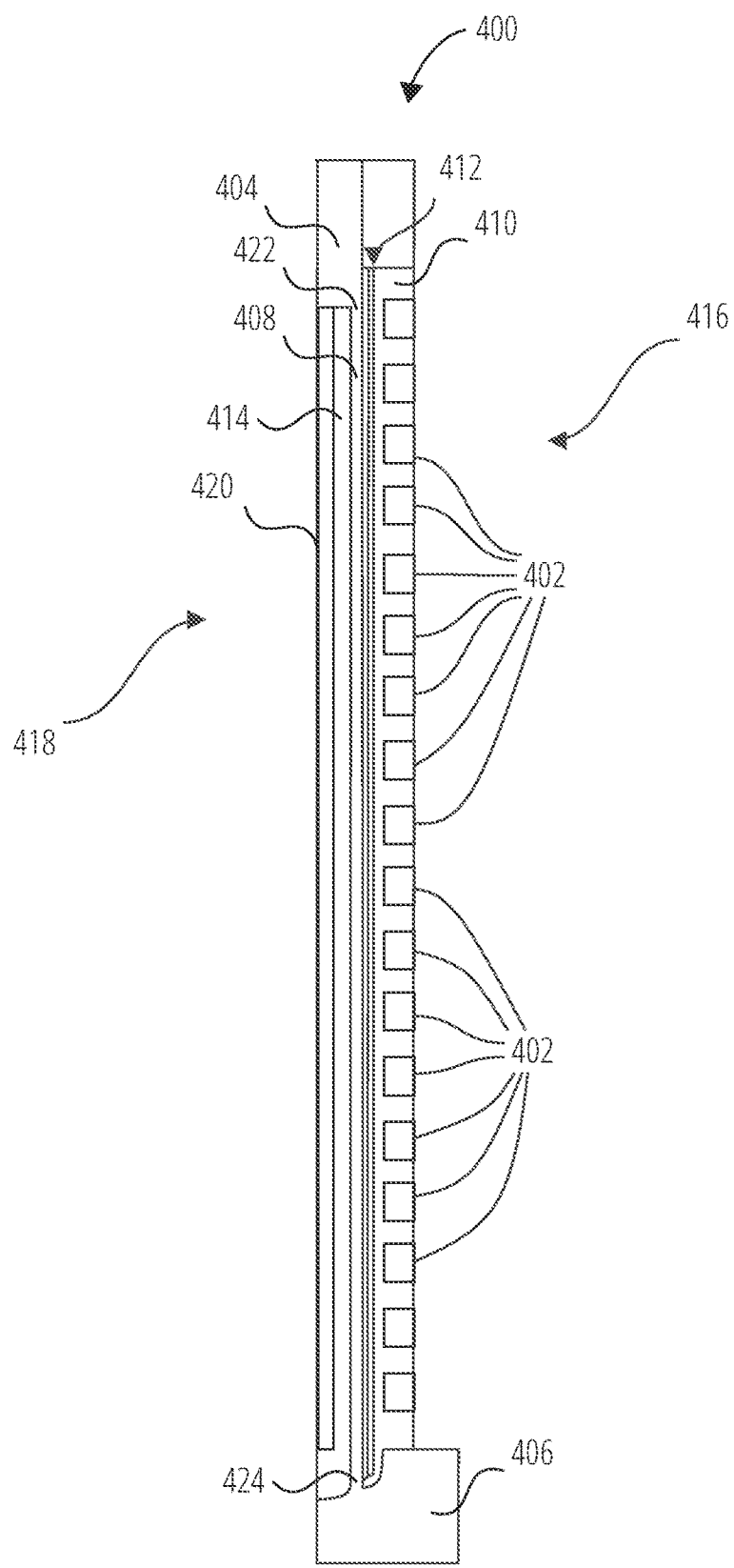
FIG. 4 is a cross-sectional view of a pillar including memory cells and having a full-length back gate electrically connected to a bit line, according to some embodiments.
Figure 6:
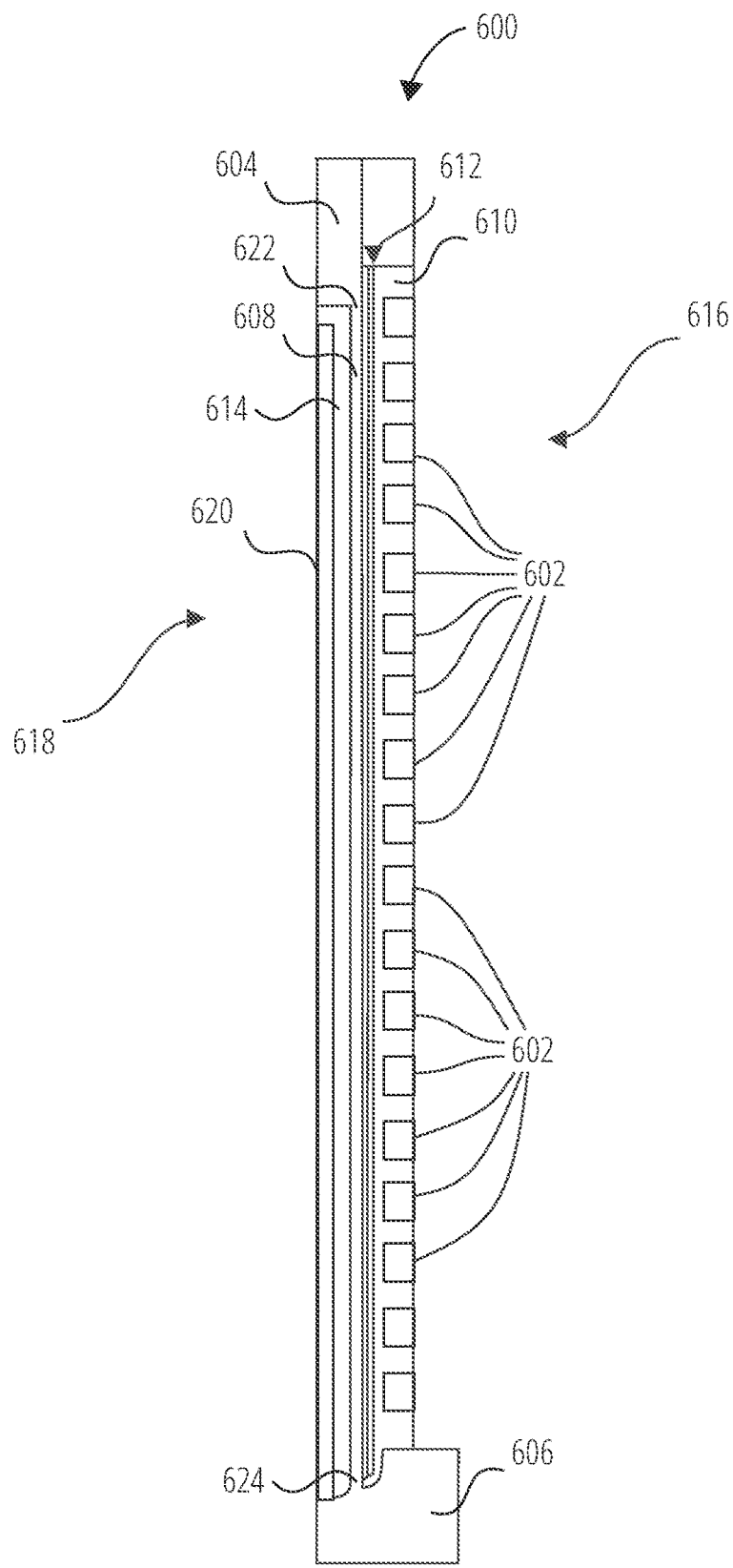
FIG. 6 is a cross-sectional view of a pillar including memory cells and having a full-length back gate electrically connected to a source region, according to some embodiments.
Figure 7:
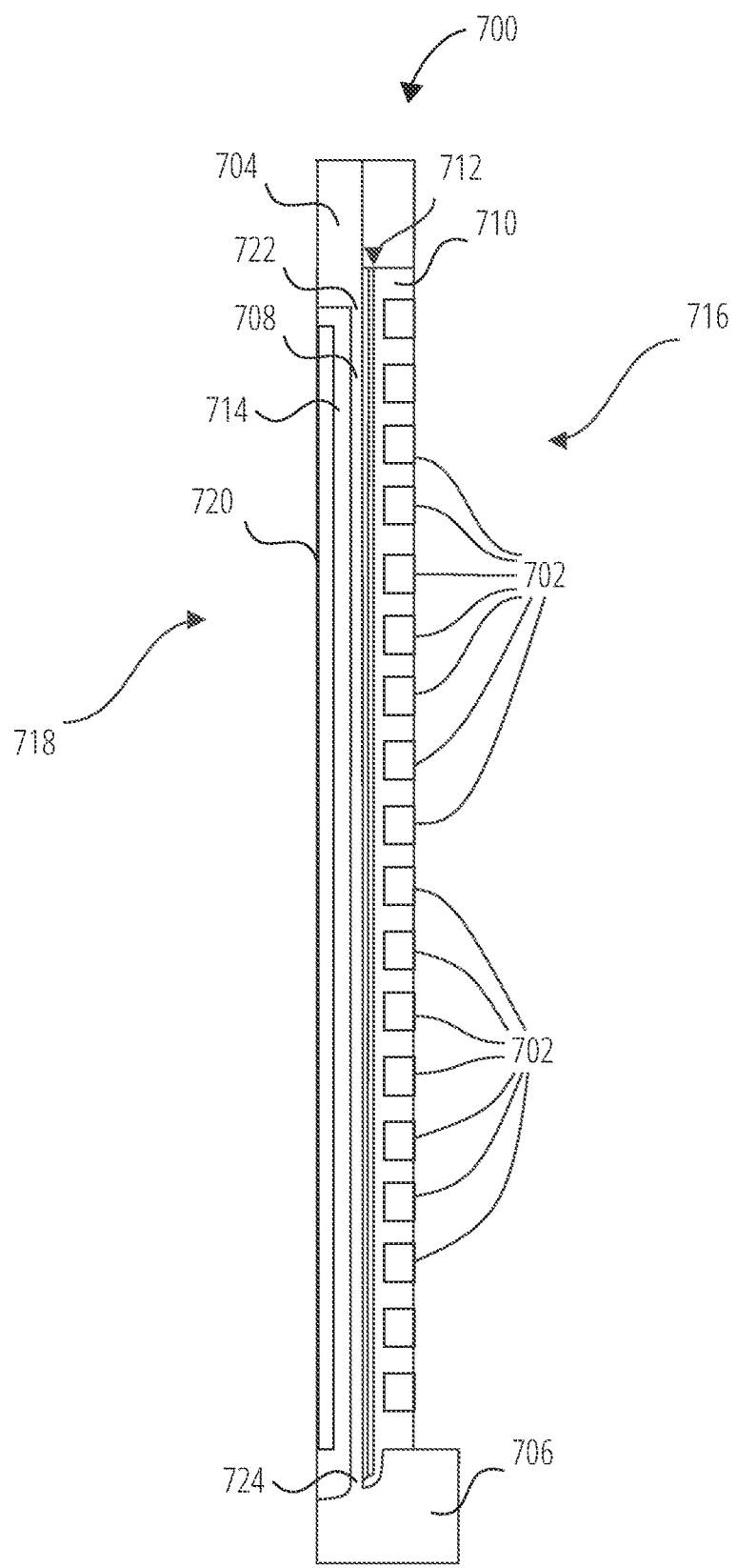
FIG. 7 is a cross-sectional view of a pillar including memory cells and having an electrically floating, full-length back gate, according to some embodiments.

In some embodiments the back gate 120 extends proximate to the second side 118 of the channel material 108 along at least substantially an entire length of the channel material 108. FIG. 4, FIG. 6, and FIG. 7 illustrate examples of pillars (pillar 400, pillar 600, and pillar 700, respectively) including back gates (back gate 420, back gate 620, and back gate 720, respectively) that extend along at least substantially the entire length of the channel material (channel material 408, channel material 608, and channel material 708, respectively). In some such embodiments the back gate 120 is electrically connected to the bit line 104 (e.g., FIG. 4). In other such embodiments the back gate 120 is electrically connected to the source region 106 (e.g., FIG. 6). In still other such embodiments the back gate 120 is electrically floating (e.g., FIG. 7).

Figure 2:
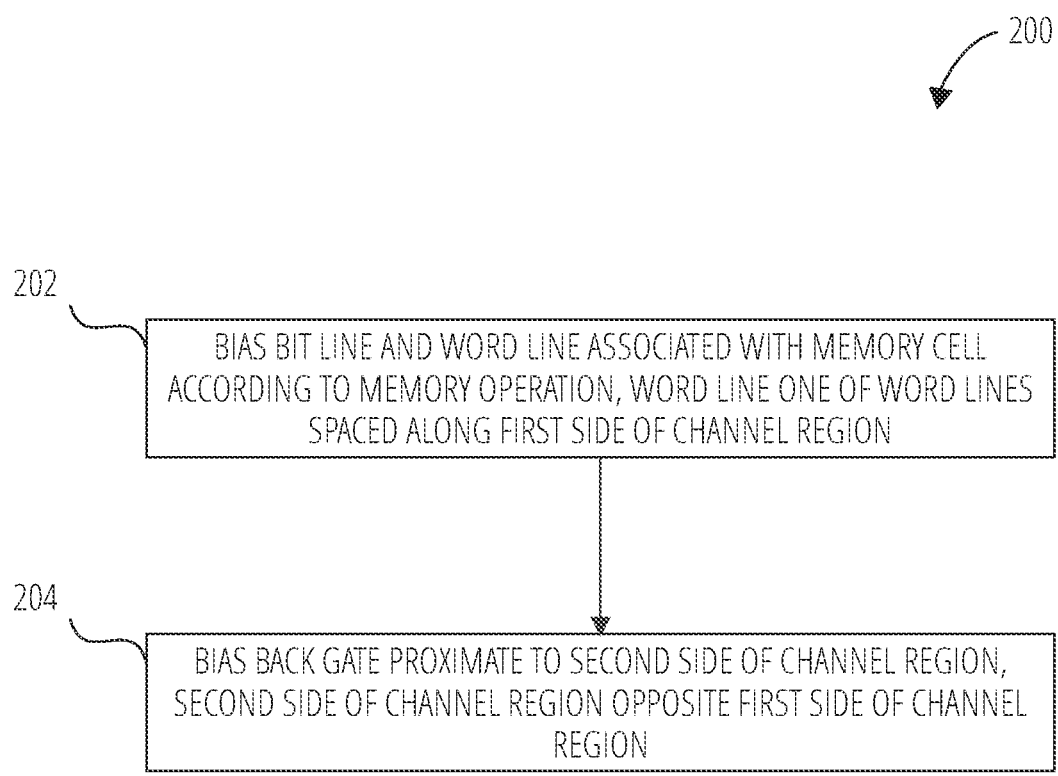
FIG. 2 is a flowchart illustrating a method of accessing a memory cell, according to some embodiments.

FIG. 2 is a flowchart illustrating a method 200 of accessing a memory cell (e.g., a memory cell of the pillar 100 of FIG. 1), according to some embodiments. Referring to FIG. 1 and FIG. 2 together, in operation 202, method 200 includes biasing a bit line 104 and a word line associated with the memory cell according to a memory operation. The word line is one of word lines 102 spaced along the first side 116 of the channel material 108.

In operation 204, method 200 includes biasing the back gate 120 proximate to the second side 118 of the channel material 108. As previously discussed, the second side 118 of the channel material 108 is opposite the first side 116 of the channel material 108. In some embodiments biasing the back gate 120 includes biasing the bit line 104, the bit line electrically connected to the back gate 120 (e.g., FIG. 3 and FIG. 4). In some embodiments biasing the back gate 120 includes biasing a source region 106 electrically connected to the back gate 120 (e.g., FIG. 5 and FIG. 6). In some embodiments biasing the back gate 120 includes biasing an electrically conductive material extending along only a portion of an entire length of the channel material 108 (e.g., FIG. 3 and FIG. 5). In some embodiments biasing the back gate 120 includes biasing an electrically conductive material extending along at least substantially an entire length of the channel material 108 (e.g., FIG. 4 and FIG. 6).

FIG. 3 is a cross-sectional view of a pillar 300 including memory cells and having a partial-length back gate 320 electrically connected to a bit line 304, according to some embodiments. The pillar 300 is an example of the pillar 100 of FIG. 1. The pillar 300 includes word lines 302, a bit line 304, a source region 306, a channel material 308 (having a first side 316, a second side 318, a first end 322, and a second end 324), a first insulator 310 (having electrical insulators 312), a second insulator 314, and a back gate 320 similar to the word lines 102, bit line 104, source region 106, channel material 108 (having the first side 116, second side 118, first end 122, and second end 124), first insulator 110 (having electrical insulators 112), second insulator 114 and back gate 120, of the pillar 100 of FIG. 1.

The back gate 320 of the pillar 300 of FIG. 3 is electrically connected to the bit line 304 and extends from the bit line 304 proximate to the second side 318 of the channel material 308 along only a portion of the entire length of the channel material 308. For example, the back gate 320 may extend behind only some SGD memory cells of the pillar 300.

As the back gate 320 is biased with the bit line 304 during memory operations involving the pillar 300, voltage potentials of the back gate 320 influence electrical properties of the channel material 308 proximate to the back gate 320. The biasing of the back gate 320 with the bit line 304 may improve the SGD GIDL without having a significant impact on string current, SGS GIDL, and boosting.

FIG. 4 is a cross-sectional view of a pillar 400 including memory cells and having a full-length back gate 420 electrically connected to a bit line 404, according to some embodiments. The pillar 400 is an example of the pillar 100 of FIG. 1. The pillar 400 includes word lines 402, a bit line 404, a source region 406, a channel material 408 (having a first side 416, a second side 418, a first end 422, and a second end 424), a first insulator 410 (having electrical insulators 412), a second insulator 414, and a back gate 420 similar to the word lines 102, bit line 104, source region 106, channel material 108 (having the first side 116, second side 118, first end 122, and second end 124), first insulator 110 (having electrical insulators 112), second insulator 114, and back gate 120 of the pillar 100 of FIG. 1.

The back gate 420 of the pillar 400 of FIG. 4 is electrically connected to the bit line 404 and extends from the bit line 404 proximate to the second side 418 of the channel material 408 along substantially the entire length of the channel material 408. For example, the back gate 420 may extend behind at least substantially all of the memory cells of the pillar 400.

As the back gate 420 is biased with the bit line 404 during memory operations involving the pillar 400, voltage potentials of the back gate 420 influence electrical properties of the channel material 408 proximate to the back gate 420. For example, a voltage potential at the back gate 420 along substantially the entire length of the channel material 408 may cause a back side channel to form in the channel material 408, increasing the string current. The biasing of the back gate 420 with the bit line 404 may also improve the SGD GIDL without having a significant impact on SGS GIDL. The biasing of the back gate 420 may in some instances, however, have an undesirable impact on boosting.

FIG. 5 is a cross-sectional view of a pillar 500 including memory cells and having a partial-length back gate 520 electrically connected to a source region 506, according to some embodiments. The pillar 500 is an example of the pillar 100 of FIG. 1. The pillar 500 includes word lines 502, a bit line 504, a source region 506, a channel material 508 (having a first side 516, a second side 518, a first end 522, and a second end 524), a first insulator 510 (having electrical insulators 512), a second insulator 514, and a back gate 520 similar to the word lines 102, bit line 104, source region 106, channel material 108 (having the first side 116, second side 118, first end 122, and second end 124), first insulator 110 (having electrical insulators 112), second insulator 114 and back gate 120, of the pillar 100 of FIG. 1.

The back gate 520 of the pillar 500 of FIG. 5 is electrically connected to the source region 506 and extends from the source region 506 proximate to the second side 518 of the channel material 508 along only a portion of the entire length of the channel material 508. For example, the back gate 520 may extend behind only some SGS memory cells of the pillar 500.

As a voltage potential of the back gate 520 is held to a same value as the source region 506 during memory operations involving the pillar 500, the voltage potential of the back gate 520 influences electrical properties of the channel material 508 proximate to the back gate 520. For example, string current and SGS GIDL (e.g., due to a relatively higher source side resistance of the channel material 508) may be improved without having a significant impact on SGD GIDL and boosting.

FIG. 6 is a cross-sectional view of a pillar 600 including memory cells and having a full-length back gate 620 electrically connected to a source region 606, according to some embodiments. The pillar 600 is an example of the pillar 100 of FIG. 1. The pillar 600 includes word lines 602, a bit line 604, a source region 606, a channel material 608 (having a first side 616, a second side 618, a first end 622, and a second end 624), a first insulator 610 (having electrical insulators 612), a second insulator 614, and a back gate 620 similar to the word lines 102, bit line 104, source region 106, channel material 108 (having the first side 116, second side 118, first end 122, and second end 124), first insulator 110 (having electrical insulators 112), second insulator 114 and back gate 120, of the pillar 100 of FIG. 1.

The back gate 620 of the pillar 600 of FIG. 6 is electrically connected to the source region 606 and extends from the source region 606 proximate to the second side 618 of the channel material 608 along at least substantially the entire length of the channel material 608. For example, the back gate 620 may extend behind at least substantially all of the memory cells of the pillar 600.

As a voltage potential of the back gate 620 is held to a same value as the source region 606 during memory operations involving the pillar 600, voltage potentials of the back gate 620 influence electrical properties of the channel material 608 proximate to the back gate 620. For example, an SGS GIDL may be improved without effecting SGD GIDL. Although the electrical connection of the back gate 620 to the source region 606 increases source side resistance of the channel material 608, it may also result in a back gate effect, which may cancel out the resulting improvements in string current. Also, an undesirable impact on boosting may be observed.

FIG. 7 is a cross-sectional view of a pillar 700 including memory cells and having an electrically floating, full-length back gate 720, according to some embodiments. The pillar 700 is an example of the pillar 100 of FIG. 1. The pillar 700 includes word lines 702, a bit line 704, a source region 706, a channel material 708 (having a first side 716, a second side 718, a first end 722, and a second end 724), a first insulator 710 (having electrical insulators 712), a second insulator 714, and a back gate 720 similar to the word lines 102, bit line 104, source region 106, channel material 108 (having the first side 116, second side 118, first end 122, and second end 124), first insulator 110 (having electrical insulators 112), second insulator 114 and back gate 120, of the pillar 100 of FIG. 1.

The back gate 720 of the pillar 700 of FIG. 7 is electrically floating and extends proximate to the second side 718 of the channel material 708 along at least substantially the entire length of the channel material 708. For example, the back gate 720 may extend behind at least substantially all of the memory cells of the pillar 700.

The back gate 720 is electrically floating during memory operations involving the pillar 700, influencing electrical properties of the channel material 708 proximate to the back gate 720. Although this may result in relatively small influences on string current and GIDL (SGD GIDL, SGS GIDL), a floating back gate 720 may equalize a voltage potential drop between programmed and erased parts of the string during program inhibit and may prevent hot carrier effects. Also, the floating back gate 720 may also reduce a number of initial hot carriers as a lateral field is reduced, but injection of existing carriers may be enhanced due to a higher vertical field. As a result, hot carrier (e.g., electron) injection current into disturbed cells may be enhanced due to the floating back gate 720.

Figure 8:
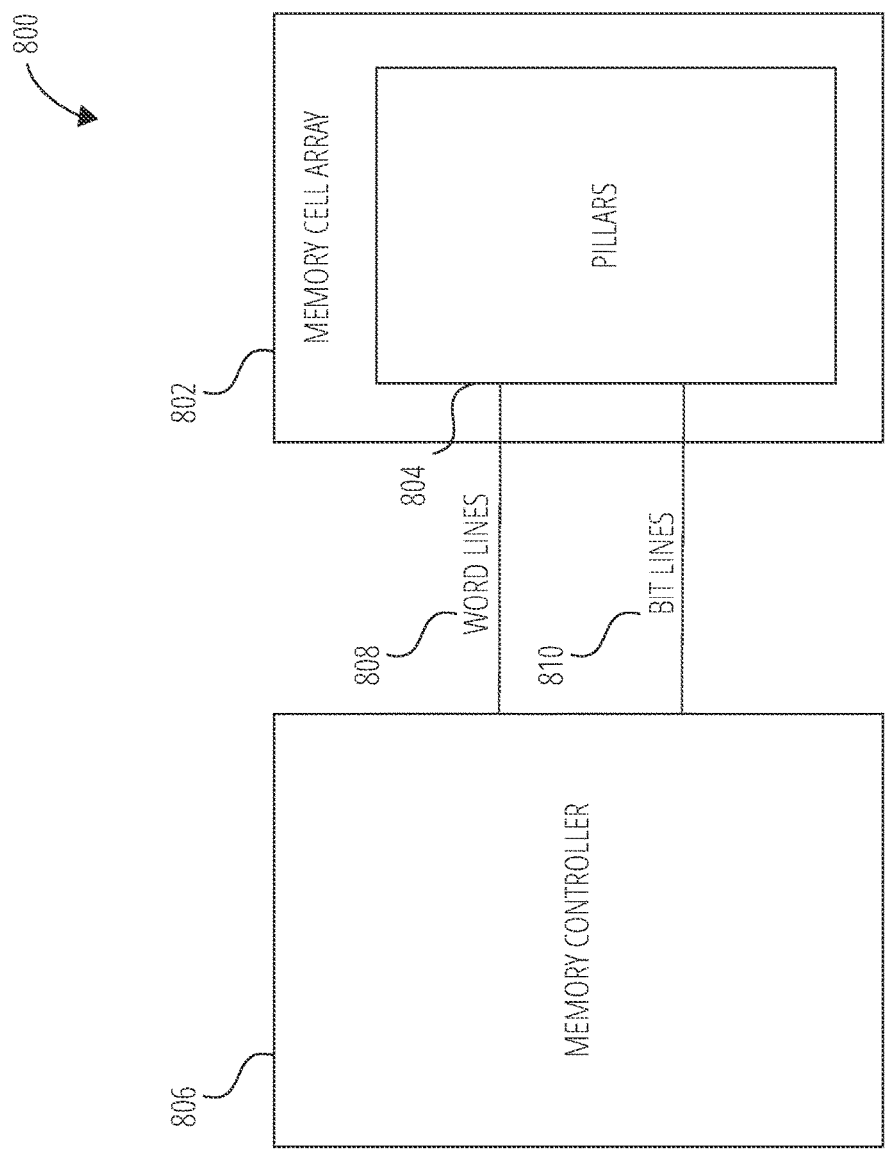
FIG. 8 is a block diagram of a memory device, according to some embodiments.

FIG. 8 is a block diagram of a memory device 800, according to some embodiments. For example, the memory device 800 may include a three-dimension NAND Flash memory device. The memory device 800 includes a memory cell array 802 including pillars 804. Each of the pillars 804 may include memory cells. The pillars 804 include at least one of the pillar 100 of FIG. 1. By way of non-limiting example, the pillars 804 may include at least one of the pillar 300 of FIG. 3, at least one of the pillar 400 of FIG. 4, at least one of the pillar 500 of FIG. 5, at least one of the pillar 600 of FIG. 6, at least one of the pillar 700 of FIG. 7, or combinations thereof.

The memory device 800 also includes a memory controller 806 operably coupled to the memory cell array 802. For example, the memory controller 806 may be operably coupled to the memory cell array 802 via word lines 808 and bit lines 810, which are operably coupled to the word lines 102 and the bit line 104 of the pillar 100 of FIG. 1. By way of non-limiting example, the word lines 808 and the bit lines 810 may be operably coupled to the word lines 302 and the bit line 304 of the pillar 300 of FIG. 3, the word lines 402 and the bit line 404 of the pillar 400 of FIG. 4, the word lines 502 and the bit line 504 of the pillar 500 of FIG. 5, the word lines 602 and the bit line 604 of the pillar 600 of FIG. 6, the word lines 702 and the bit line 704 of the pillar 700 of FIG. 7, or combinations thereof. As a result, the memory controller 806 is configured to execute memory operations (e.g., read, write, erase, etc.) on the memory cells of the pillars 804 by biasing the word lines 808 and the bit lines 810. In some embodiments the memory controller 806 is configured to perform the method 200 of FIG. 2.

Figure 9:
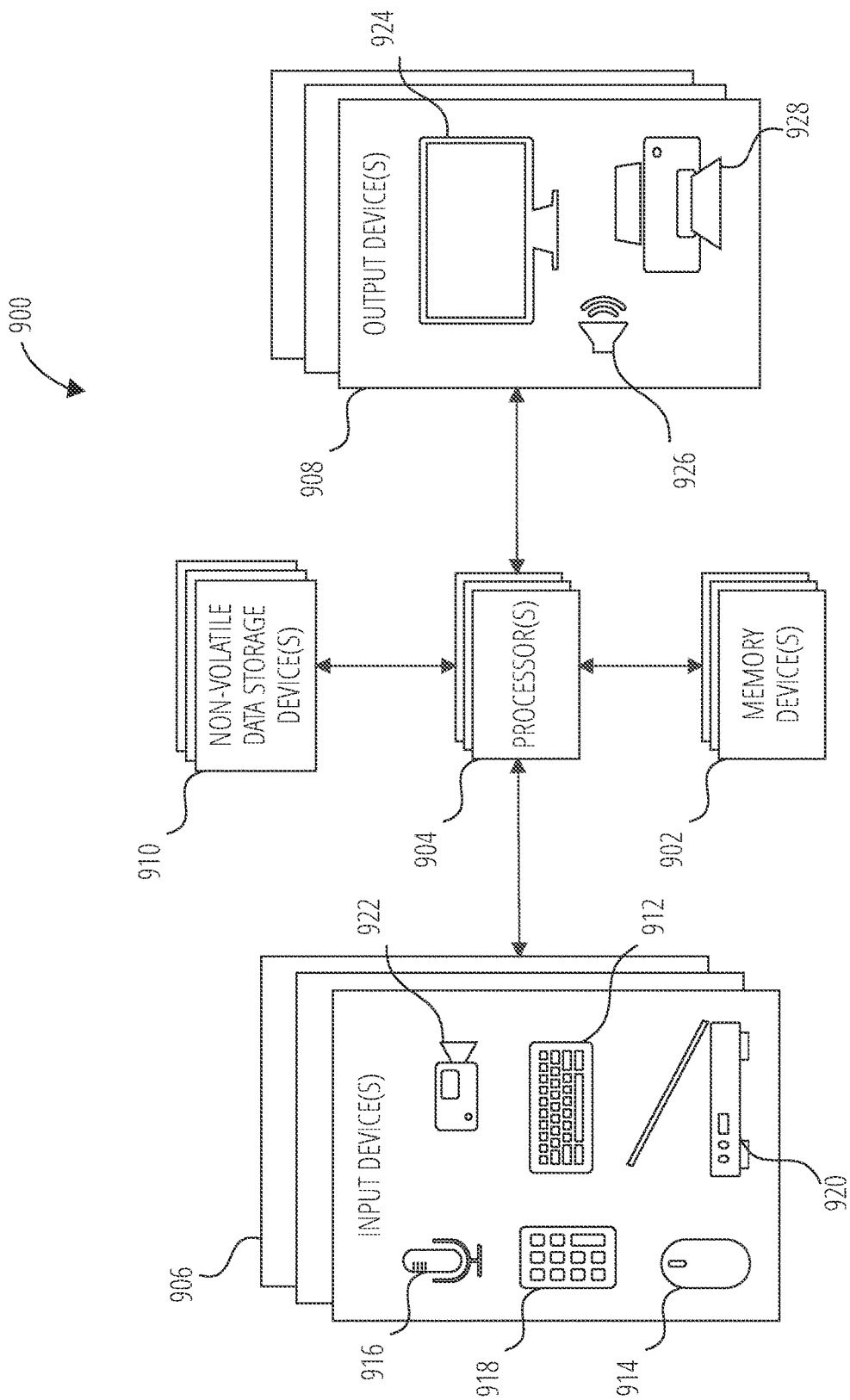
FIG. 9 is a block diagram of a computing system, according to some embodiments.

FIG. 9 is a block diagram of a computing system 900, according to some embodiments. The computing system 900 includes one or more processors 904 operably coupled to one or more memory devices 902, one or more non-volatile data storage devices 910, one or more input devices 906, and one or more output devices 908. In some embodiments the computing system 900 includes a personal computer (PC) such as a desktop computer, a laptop computer, a tablet computer, a mobile computer (e.g., a smartphone, a personal digital assistant (PDA), etc.), a network server, or other computer device. In some embodiments the memory devices 902 may include the memory device 800 of FIG. 8.

In some embodiments the one or more processors 904 may include a central processing unit (CPU) or other processor configured to control the computing system 900. In some embodiments the one or more memory devices 902 include random access memory (RAM), such as volatile data storage (e.g., dynamic RAM (DRAM) static RAM (SRAM), etc.). In some embodiments the one or more non-volatile data storage devices 910 include a hard drive, a solid-state drive, Flash memory, erasable programmable read only memory (EPROM), other non-volatile data storage devices, or any combination thereof. In some embodiments the one or more input devices 906 include a keyboard 912, a pointing device 914 (e.g., a mouse, a track pad, etc.), a microphone 916, a keypad 918, a scanner 920, a camera 922, other input devices, or any combination thereof. In some embodiments the output devices 908 include an electronic display 924, a speaker 926, a printer 928, other output devices, or any combination thereof.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. An apparatus, comprising:
   a channel material comprising a first side and a second side opposite the first side;
   word lines comprising electrically conductive material spaced along the first side of the channel material;
   a bit line comprising additional electrically conductive material, an end of the channel material electrically connected to the bit line; and
   a back gate comprising further electrically conductive material proximate to the second side of the channel material, the back gate in physical contact with the bit line.

2. The apparatus of claim 1, further comprising:
   a first insulator comprising electrically insulating material between the word lines and the first side of the channel material; and
   a second insulator comprising additional electrically insulating material between the back gate and the second side of the channel material.

3. The apparatus of claim 1, wherein the back gate extends proximate to the second side of the channel material substantially along an entire length of the channel material.

4. The apparatus of claim 1, wherein the back gate extends proximate to the second side of the channel material along only a portion of an entire length of the channel material.

5. The apparatus of claim 1, wherein the back gate is in physical contact with the bit line at a first end of the channel material.

6. The apparatus of claim 1, further comprising a source region, a second end of the channel material electrically connected to the source region.

7. The apparatus of claim 1, wherein the apparatus comprises a three-dimensional NAND memory device.

8. An apparatus, comprising:
   a channel material comprising a first side and a second side opposite the first side;
   word lines spaced along the first side of the channel material;
   a source region, an end of the channel material electrically connected to the source region; and
   a back gate proximate the second side of the channel material, the back gate in physical contact with doped semiconductor material of the source region.

9. The apparatus of claim 8, further comprising:
   a first insulator extending from and between the word lines and the first side of the channel material; and
   a second insulator extending from and between the back gate and the second side of the channel material.

10. The apparatus of claim 8, wherein the back gate extends proximate to the second side of the channel material across less than an entirety of a length of the channel material.

11. The apparatus of claim 8, wherein the back gate extends proximate to the second side of the channel material across substantially an entirety of a length of the channel material.

12. The apparatus of claim 8, wherein the back gate is in physical contact with the doped semiconductor material of the source region at a first end of the channel material.

13. The apparatus of claim 8, further comprising a bit line, a first end of the channel material electrically connected to the bit line.

14. The apparatus of claim 8, wherein the apparatus comprises a three-dimensional NAND memory device.

15. An apparatus comprising:
    a channel material having a first side and a second side opposite the first side;
    insulators on the first side and the second side of the channel material;
    conductive word lines spaced along the first side of the channel material;
    a conductive back gate extending across a second side of the channel material, the conductive back gate configured to electrically float; and
    a bit line overlying the channel material and the conductive back gate, the bit line electrically connected to the channel material and electrically isolated from the conductive back gate.

16. The apparatus of claim 15, further comprising a quantity of memory cells partially defined by the channel material, the conductive back gate extending across substantially all of the quantity of memory cells.

17. The apparatus of claim 15, wherein the conductive back gate extends substantially along an entire length of the channel material.

18. The apparatus of claim 15, wherein the apparatus comprises a three-dimensional NAND memory device.

* * * * *